United States Patent [19]

Baliga et al.

[11] Patent Number: 4,961,100

[45] Date of Patent: Oct. 2, 1990

[54] BIDIRECTIONAL FIELD EFFECT SEMICONDUCTOR DEVICE AND CIRCUIT

[75] Inventors: Bantval J. Baliga, Schenectady; Hsueh-Rong Chang, Scotia, both of N.Y.; Edward K. Howell, Simsbury, Conn.

[73] Assignee: General Electric Company, Schenectady, N.Y.

[21] Appl. No.: 208,448

[22] Filed: Jun. 20, 1988

[51] Int. Cl.$^5$ .................. H01L 29/747; H01L 29/74; H01L 29/10

[52] U.S. Cl. ...................................... 357/39; 357/38; 357/23.4

[58] Field of Search ...................... 357/39, 38, 23.4, 22

[56] References Cited

U.S. PATENT DOCUMENTS

| | | | |
|---|---|---|---|
| 4,062,032 | 12/1977 | Nielson | 357/38 |
| 4,568,958 | 2/1986 | Baliga | 357/23.4 |
| 4,755,867 | 7/1988 | Cheng | 357/23.4 |

Primary Examiner—Rolf Hille
Assistant Examiner—Wael Fahmy
Attorney, Agent, or Firm—Robert Ochis; James C. Davis, Jr.; Marvin Snyder

[57] ABSTRACT

An insulated field effect semiconductor device having source and drain regions extending to opposed surfaces of its semiconductor body is bidirectional and capable of blocking voltages in either of two opposing polarities and comprises a four terminal device having source and drain electrodes disposed on the opposed surfaces and a base electrode all ohmically connected to corresponding portions of the semiconductor body. An insulated gate is provided in a trench which extends into the semiconductor body for controlling the conductivity of a channel region extending within the base region between the source and drain regions. The device is free of source-to-base and drain-to-base short circuits. Control circuits enable this device to conduct or block both polarities of a high current AC voltage applied across its source and drain terminals while preventing undesired avalanche breakdown within the device.

7 Claims, 4 Drawing Sheets

BIDIRECTIONAL FIELD EFFECT SEMICONDUCTOR DEVICE AND CIRCUIT

BACKGROUND OF THE INVENTION

1. Field of the Invention

The present invention relates to field effect devices and circuits and more particularly, to devices and circuits intended to control current flow and block voltages in two opposing polarities.

2. Prior Art

A discrete field effect transistor comprises source and drain regions spaced apart by an intervening base region and includes an insulated gate electrode disposed adjacent the base region between the source and drain regions to control the conductivity of the channel region extending between the source and drain regions. Such a discrete field effect transistor is a three terminal device having source, drain and gate electrodes with the source electrode in ohmic contact with both the source region and a portion of the base region which is remote from the channel region. Thus, the source electrode short circuits the portion of the source/base PN junction it extends across. As a consequence, field effect transistors of this structure can block high voltages in only one direction since only their base/drain PN junction is capable of supporting reverse bias voltages.

There is a need for AC switches capable of controlling the flow of AC current in either direction in relatively low voltage applications with low ON-resistance. That is, applications in which the voltage applied across the field effect transistor in the OFF state is less than about 25–50 volts and the voltage drop across the transistor in the ON state is small, typically less than about 10 millivolts.

Accordingly, it is a primary object of the present invention to provide a field effect transistor AC switch which has a low ON-resistance and which is capable of blocking both polarities of an alternating voltage.

It is another object to provide an AC switch in which a single control signal can control conduction independent of the polarity of the signal applied to main terminals of the device.

It is a further object to provide a field effect transistor AC switch employing only a single field effect device.

It is a still further object to provide a field effect transistor circuit capable of controlling current flow in both polarities while exhibiting a minimum ON-resistance.

SUMMARY OF THE INVENTION

The foregoing and other objects are accomplished by a four terminal field effect semiconductor device comprising first and second main terminal regions, or source and drain regions, a base region disposed between them and an insulated gate electrode disposed adjacent to, but insulated from, the base region. The four terminals include a first main electrode, a second main electrode and an insulated gate electrode—the three electrodes which are typical of prior art discrete FETs—and, in addition, a base electrode disposed in ohmic contact with the base region. The device is free of source-to-base region and drain-to-base region shorts. The conductivity of this device between the main electrodes is controlled by the potential of the gate electrode relative to the base region.

In a preferred embodiment, the first main region is disposed adjacent a first surface of the semiconductor body and the second main region is disposed adjacent a second, opposing surface of the semiconductor body. The insulated gate electrode is disposed in trenches which extend into the semiconductor body through the first main region and the base region to control the conductivity of a channel region portion of the base region which extends from the first main region to the second main region.

In an embodiment of the device capable of blocking higher voltages, the second main region includes a lightly doped portion disposed between the base region and a heavily doped (high conductivity) portion of the second main region.

Circuits including this device enable positive control of an AC circuit independent of the instantaneous polarity of the AC signal. Inclusion of a clamping circuit ensures against undesired voltage and current conditions within the device and clamps the voltage across the main terminals of the device, thereby preventing activation of the parasitic bipolar transistor which is inherent in the field-effect device.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

One technique which could be used for controlling AC current flow in both polarities is to connect two field effect transistors back-to-back in series (source terminal to source terminal) so that each blocks high voltages of a different polarity. Such a configuration would have the disadvantage of increasing the ON-resistance of the switch over that of a single FET since that series connection of two identical FETs would exhibit twice the ON-resistance of one of them. This would be a substantial drawback in circuits which conduct substantial current since it would increase both the voltage drop across the switch and the power dissipation in the switch.

Figure 1:
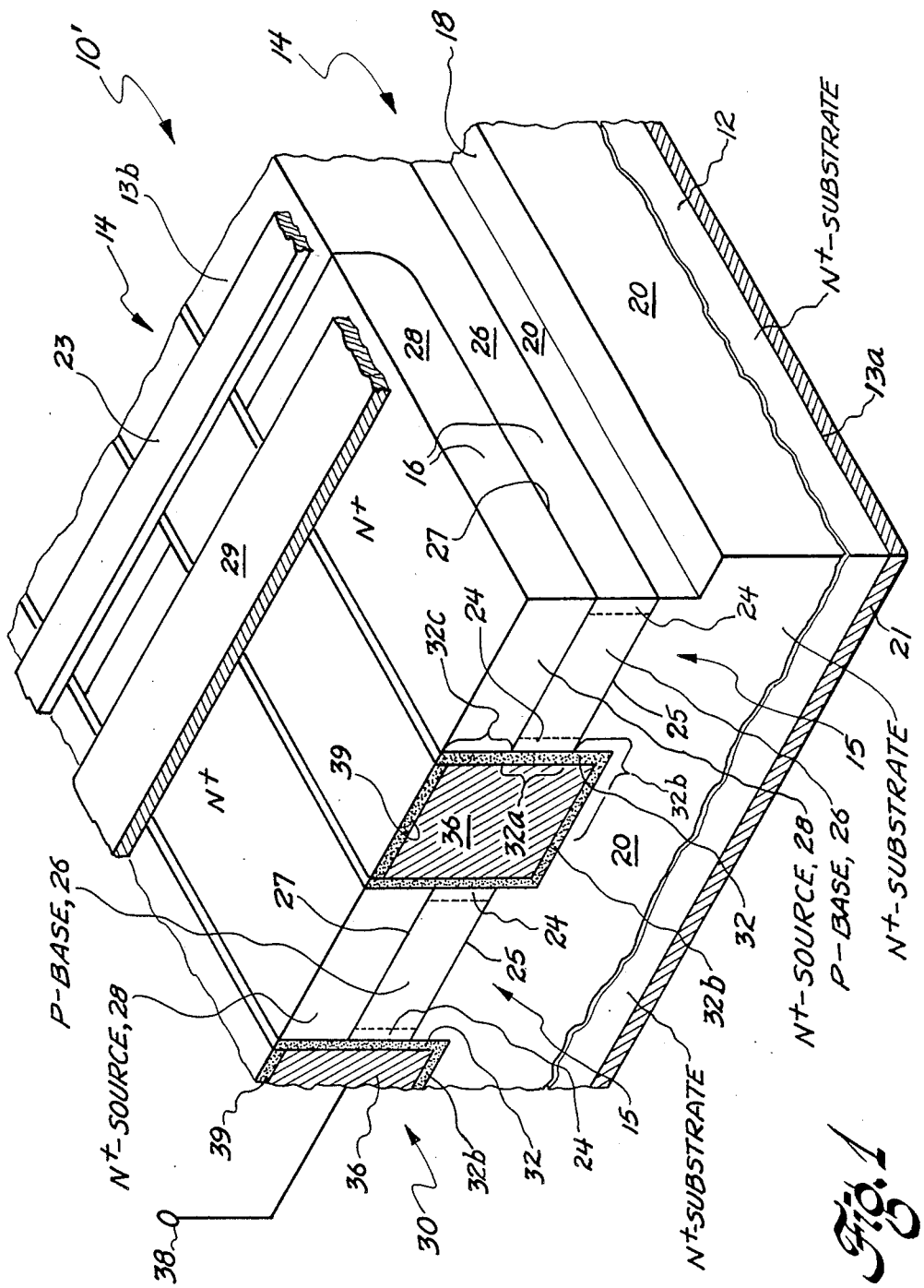
FIG. 1 illustrates, in a perspective cutaway, view, a portion of a device 10 in accordance with the present invention.

In FIG. 1, an N-channel, enhancement-mode field effect semiconductor device 10 in accordance with the present invention is illustrated. This device comprises a body 12 of semiconductor material having a heavily doped N type (N+) substrate or first main (drain) region 20 disposed adjacent to a first major surface 13a of the semiconductor body 12, a P type base region 26 disposed adjacent to and forming a PN junction 25 with the N+ substrate region 20 and and N+ second main (source) region 28 disposed adjacent to and forming a PN junction 27 with the base region 26. The second main region 28 is spaced from the first main region and extends to a second major surface 13b of the semiconductor body. A plurality of trenches 14 extend downward into the semiconductor body 12 from its upper or second surface 13b and create or define mesas 15 which extend upward to the second major surface from the floors of the trenches. The mesas 15 space the trenches apart. Each of the trenches 14 extends through the first main region 28 and the base region 26 to or into the substrate or second main region 20. The mesa sidewalls 16 which form the sides of the trenches have a gate insulating layer 32 disposed on their surfaces. The portion 32a of this gate oxide layer where the base region 26 extends to the trench walls is relatively thin, while the portion 32b of layer 32 adjacent to the trench floors or bottom walls 18 and the portion 32c adjacent the first main region may be thicker in order to increase the breakdown voltage of the gate oxide adjacent the first and second main regions. However, except in situations where symmetric characteristics are desired, the entire gate oxide layer 32 preferably has a single, uniform thickness.

The remainder of the trench is occupied by a conductive material 36 which serves as the electrically conducting portion of the insulated gate electrode. An external gate contact 38 is shown schematically at the left side of FIG. 1. The conductive material 36 and the oxide layer 32 have been omitted from the righthand trench in FIG. 1 in order to illustrate the internal structure of the mesas 15. The insulating layer 32 and the conductive material 36 along with the external gate contact 38 comprise the insulated gate electrode 30 for controlling the conductivity of a channel region 24 of the base region which extends from the first main region to the second main region. An insulating layer 39 is disposed over conductive material 36 in order to insulate it from the overlying second main electrode 29.

Further information on semiconductor wafers and devices which include trench structures of this general configuration is contained in U.S. patent applications Ser. No. 938,692, entitled "Semiconductor Devices Exhibiting Minimum On-Resistance" and Ser. No. 938,666, entitled "Method of Fabricating a Semiconductor Device", both filed Dec. 5, 1986 by Victor A. K. Temple, assigned to the instant assignee and incorporated herein, by reference, in their entirety.

The device 10 includes a first main terminal (drain) electrode 21 disposed in ohmic contact with the N+ substrate 20 and a second main terminal (source) electrode 29 disposed in ohmic contact with the N+ second main region 28. The second main electrode, 29, is shown only toward the back of FIG. 1 in order to illustrate the underlying structure. In an actual device, electrode 29 preferably extends across the trenches 14 to comprise a continuous, large-area electrode and extends over and ohmically contacts as much of the upper surface of second main region 28 as the device layout and design rules permit.

A base electrode 23 is disposed in ohmic contact with the base region 26. As illustrated in FIG. 1, it is considered preferable to have the base region 26 extend to the second surface 13b of the semiconductor body at the periphery of the device or at the ends of the mesas 15 in order to simplify the process of making an ohmic contact to the base region. However, if it were preferred to do so, it would also be feasible to form this base contact on one of the side surfaces of the semiconductor body or on a major surface of the device remote from its edge. If desired, in order to aid in forming an ohmic contact to the base region 26, a P+ region (not shown) may be formed within the P type base region 26 where the base electrode contacts the base region.

The device 10 may preferably be fabricated by starting with an N+ substrate which, in the final device, becomes the first main region, and epitaxially growing a P type layer on one surface of that wafer. In the final device, that epitaxial P type layer becomes the base region 26. The N+ second main region 28 is diffused into the P type base region 26. To provide the structure shown in FIG. 1, the N+ second main diffusion is partially masked to leave a portion of the base region 26 extending to the upper surface where the base electrode 23 may be formed or deposited on it.

After formation of the main regions and the base region, the trenches 14 are formed by removing material from body 12, beginning at the upper surface of the body. This may be done using reactive ion etching (RIE) or other techniques as may be desired. After reactive ion etching, appropriate cleanup procedures should be used to reduce surface damage caused by RIE. One such cleanup procedure is to grow an oxide layer on the trench walls and then remove that oxide by a process such as wet etching which does not damage the semiconductor surface which comprises the trench wall.

After formation of the trenches and any clean up or other preparatory processes, the surfaces of the trenches are oxidized to produce the gate insulation layer 32 in the form of silicon oxide. The trenches are then filled with a conductive material 36 such as polycrystalline silicon which serves as the conductive portion of the gate electrode. Thereafter, if the gate material does not extend to the top of the trenches, the insulating layer 39 is disposed over the gate electrode material 36 within the trenches. Otherwise, the upper portion of the gate electrode may be converted to an oxide or otherwise insulated from layers to be deposited later. Thereafter, a layer of conductive material which will form an ohmic contact both to the N+ second main region and the P type base region (or a P+ contact portion of the base region) is deposited across the upper surface of the wafer. That electrode material is subsequently defined in a photolithographic process to separate it into separate base and second main electrode portions. This same metallization layer may also be defined to create a contact metallization for the gate electrode, if a portion of the gate electrode material 36 is left exposed prior to the deposition of the metal layer and the metal definition step isolates the gate electrode contact from the base and first main electrodes.

Figure 3:
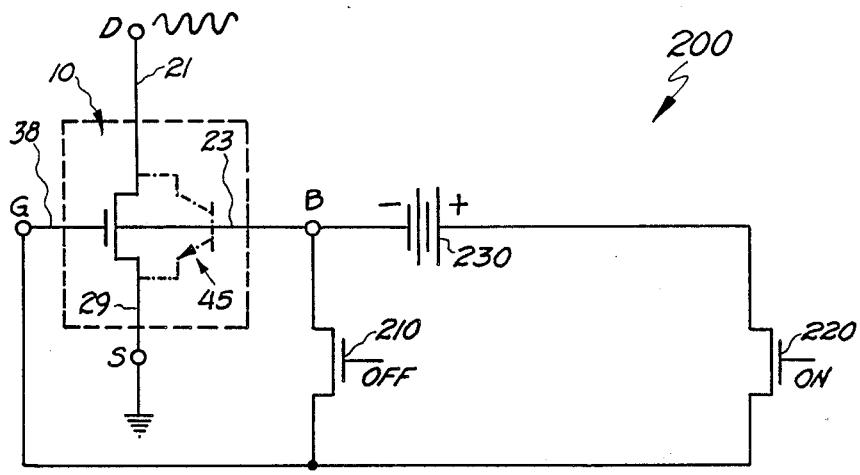
FIG. 3 is a circuit diagram of one circuit for controlling a device in accordance with either of FIGS. 1 and 2.

In FIG. 3, a control circuit 200 for controlling the device 10 of FIG. 1 is illustrated. Control circuit 200 includes two FETs 210 and 220 and a voltage source 230 which is shown as a battery. These elements are interconnected with the device 10 to control its conductive state. The NPN transistor 45 (shown in phantom in FIG. 4) connected across FET 10 is a parasitic bipolar transistor which is inherent in the FET structure. The base-emitter and base-collector PN junctions of parasitic transistor 45 are the junctions between the base region and the first and second main regions, respectively, of the FET 10 shown in FIG. 1. When device 10, shown in FIG. 3, is in the OFF state, with FET 210 conductive and FET 220 non-conductive, leakage currents of transistor 45 cause the base region 26 of FET 10 shown in FIG. 1 to assume a potential which is approximately 0.7 volts positive with respect to the more negative of main regions 20 and 28. If the normal N-channel FET terminal designation convention is followed, then the terminal names "source" and "drain" imply that the terminal designated "drain" is at a higher potential than the terminal designated "source". Thus, when main terminal 21 is positive with respect to main terminal 29, the terminal 21 functions as (1) the drain terminal of the FET 10 and (2) the collector terminal of the parasitic bipolar transistor 45 while simultaneously terminal 29 functions as the source terminal of FET 10 and the emitter terminal of the parasitic bipolar transistor 45. When the polarity of the applied voltage is reversed, the functional designations of the main terminals also reverse. In circuit applications, it is generally required that the parasitic bipolar transistor 45 be kept inactive at all times by preventing its base-emitter junction from injecting charge carriers (such as those which result from heat, high voltage or high rate-of-change of voltage) into the base region.

In control circuit 200, the FET 210 is connected between the base terminal 23 and the gate terminal 38 of the device 10. When FET 210 is rendered conductive, the device 10 is held OFF because the gate electrode 38 is at the same potential as the base region 26 of device 10 shown in FIG. 1. In the circuit of FIG. 3, a series connection of the second FET 220 and the voltage source or battery 230 is connected between the gate terminal 38 and the base terminal 23 of the device 10. The voltage source 230 is oriented to render the gate terminal 38 positive relative to the base terminal 23 when the FET 220 is conducting (for a device 10 having a P type base region and N type first and second main regions). In order to render the device 10 conductive, the FET 220 is rendered conductive and the FET 210 is rendered non-conductive to raise the potential of the gate relative to the base region.

Circuit 200 is effective for controlling the conductive state of the device 10. However, it can result in activity of the parasitic NPN transistor 45 within the device 10 since the base region 26 of device 10 shown in FIG. 1 floats relative to the first and second main regions. This problem is avoided by the control circuit 200' shown in FIG. 4 in which a clamping system 240 is provided to ensure that the base region 26 of device 10 shown in FIG. 1 does not inject current into the emitter of the parasitic NPN transistor 45. The clamping system 240 in the circuit of FIG. 4 comprises two diodes 242 and 244 which are connected back-to-back at point C where their anodes connect to each other and to the positive end of voltage source 230. The voltage source 232 is optional and its function is discussed subsequently. The diodes 242 and 244 have their cathodes connected to the first and second main terminals, respectively, of the device 10.

In operation, this clamping circuit 240 ensures that the point C is always at voltage which is no more than one diode forward voltage drop more positive than the more negative of the first and second main terminals of the device 10. This is because if the voltage at point C were to become more positive than that, the diode 242 or 244 which is connected to the more negative of the first and second main terminals would become conductive and pull the voltage at point C down to that level. In this manner, so long as the voltage V of the voltage source 230 is greater than one diode voltage drop, this clamping circuit holds the base region 26 of device 10 shown in FIG. 1 negative relative to both the first and second main regions, thereby ensuring that the PN junctions between the main regions and the base region do not become forward biased. Any current through either one of these reverse-biased junctions (whether thermally induced leakage current, displacement current of that junction's capacitance, or avalanche (or zener) breakdown current) flows, in the circuit shown in FIG. 4, through voltage source 230 and one of diodes 242 and 244 (instead of the other one of these junctions), thereby maintaining parasitic NPN transistor 45 in an inactive state.

In the event that the AC voltage applied across the source and drain terminals of the device 10 has an amplitude which approaches the avalanche breakdown voltage of either the source or drain junction and it is desired to prevent avalanche breakdown within the FET, then the amplitude of the voltage source 230 should be made close to one diode drop to minimize the voltage applied across the junction of whichever of the source or drain regions is at the more positive potential. In this way, if the applied AC voltage (peak-to-peak) is less than both the source region avalanche voltage and the drain region avalanche voltage, the increase in junction leakage current as the avalanche voltage is approached, will prevent the base region 26 of device 10 shown in FIG. 1 from floating to a voltage which is sufficiently negative to cause either the source or drain junction to avalanche. However, since the field effect threshold voltage is generally larger than one diode drop, the second voltage source 232 may then be needed in the circuit of FIG. 4 to provide the requisite gate voltage to turn device 10 ON to the fully conducting state. The voltage source 232 may be omitted if the voltage of voltage source 230 is sufficient to turn the FET fully ON.

Where symmetrical clamping of the AC voltage is desired, it is preferred that the diodes 242 and 244 provide that clamping at a voltage which is less than the avalanche breakdown voltage of the junctions within the device 10. Diodes 242 and 244 are therefore provided with equal avalanche breakdown voltages which are less than the avalanche breakdown voltage of the junction within the device 10 which has the lower avalanche breakdown voltage. The use of avalanche breakdown within the diodes 242 and 244 to clamp the voltage across the main electrodes requires that the diodes be capable of dissipating the energy produced by the full avalanche breakdown current and therefore, these diodes must be power diodes in order to handle the high energy levels to which they are subjected to in a power circuit. In a circuit in which avalanche breakdown should not occur, i.e. the avalanche voltages of all the junctions are more than the peak amplitude of the AC voltage, the diodes 242 and 244 do not need to be high power diodes since, under those circumstances, they only conduct to hold the point C within one diode forward voltage drop of the more negative of the first and second main regions. This normally does not require high energy dissipation since only forward conduction of the transient displacement current of the junction capacitance is involved.

Figure 4:
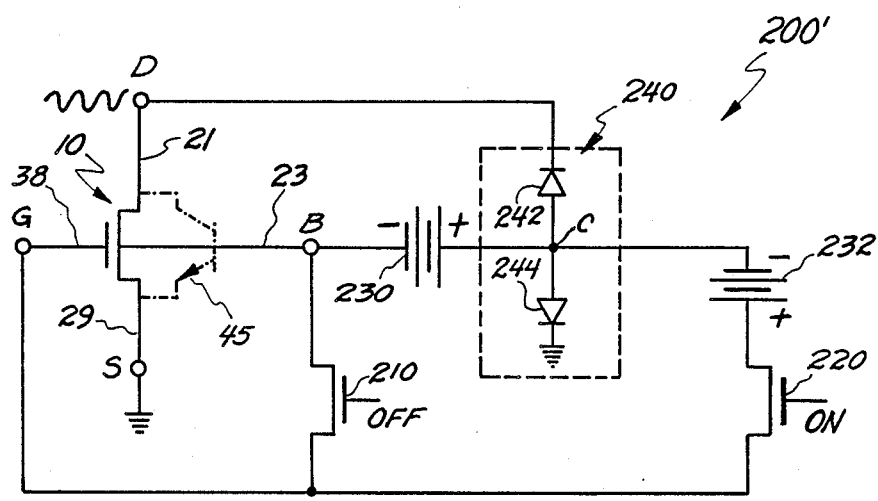
FIGS. 4 and 5 are circuit diagrams of alternative control circuits.

Alternatively, if the voltage applied across the source and drain terminals of the device has an amplitude which may or does exceed the avalanche breakdown voltage of either the source or drain junction and it is desired to utilize avalanche breakdown within the device 10 to clamp the voltage across the device 10, then the voltage of the voltage source 230 is chosen in accordance with the desired clamping voltage and the avalanche voltage of the device junctions. For example, in the circuit of FIG. 4, if the source and drain junction avalanche voltages in device 10 are both 15 volts and it is desired to clamp the voltage across device 10 at 10 volts, then the voltage source 230 is set to a voltage of 5 volts plus the ON-state forward voltage drop of the diodes 242 and 244. In this way, the base region terminal 23 is held at a voltage of substantially −5 volts relative to the more negative of terminals 21 and 29. As a result, if the terminal 21 is positive relative to terminal 29 and the first main region voltage of device 10 reaches +10 volts relative to the second main region, then the point C is held at a voltage of + one diode drop by diode 244 and the base terminal 23 is held at −5 volts. Consequently, 15 volts is applied across the PN junction between the first main region 20 and the base region 26 of the device shown in FIG. 1 and this junction will go into avalanche breakdown, thereby limiting the voltage rise of the first main electrode. The resulting avalanche breakdown current will flow through the first main electrode 21, the first main region 20, across the PN junction 25, through the base region 26, the base terminal 23, the battery 230 and the diode 244 (which are shown in FIG. 4) to the second main terminal 29, thus keeping the parasitic NPN transistor inactive. In a similar manner, when the voltage at terminal 21 in the circuit shown in FIG. 4 becomes negative, the diode 242 pulls the point C down to within at least one diode forward voltage drop of the first main region voltage. Thus, when the first main region voltage reaches −10 volts, the voltage at point C is within one diode voltage drop of −10 volts. Consequently, the base region, as a result of the presence of the battery, is at substantially −15 volts with the result that, with reference to FIG. 1, 15 volts is applied across the PN junction 27 between the second main region 28 and the base region 26 and that junction will go into avalanche breakdown with the avalanche current flowing from the second main electrode 29 into the second main region 28 across the PN junction 27 into the base region 26, through the base terminal 23, the battery 230 and the diode 242 which are shown in FIG. 4, to the first main terminal 21. Thus, no current flows through the base to the first main PN junction and the parasitic NPN transistor 45 remains inactive.

Naturally, use of avalanche breakdown within the device 10 as a clamping mechanism requires that the device 10 be sufficiently rugged to withstand the energy produced by the avalanche breakdown current that the circuit imposes on the device and diodes 242 and 244 must be capable of handling this current without excessive voltage drop. If symmetric clamping is desired while using the avalanche voltages of the junctions within device 10, then the device structure must be controlled to provide equal breakdown voltages. Alternatively, diodes having lower breakdown voltages than the main junctions may be integrated in the same chip to cause avalanching at the same voltage in both polarities. Alternatively, an integrated diode may be placed in electrical parallel with only the higher breakdown voltage junction in order to make both of the breakdown voltages measured at the external terminals of the device equal to the breakdown voltage of the lower voltage junction.

Figure 5:
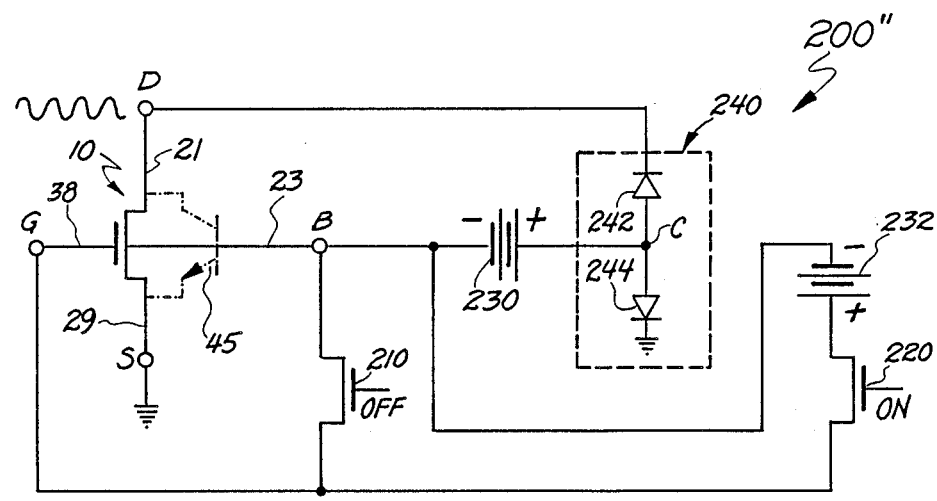

An alternative version 200″ of the circuit 200′ is illustrated in FIG. 5. Circuit 200″ of FIG. 5 has the voltage source 232 connected directly to the base terminal 23 of the FET rather than having the voltage source 230 connected in between it and the base terminal 23. The circuits 200″ and 200′ are otherwise similar and operate in a similar manner.

Figure 2:
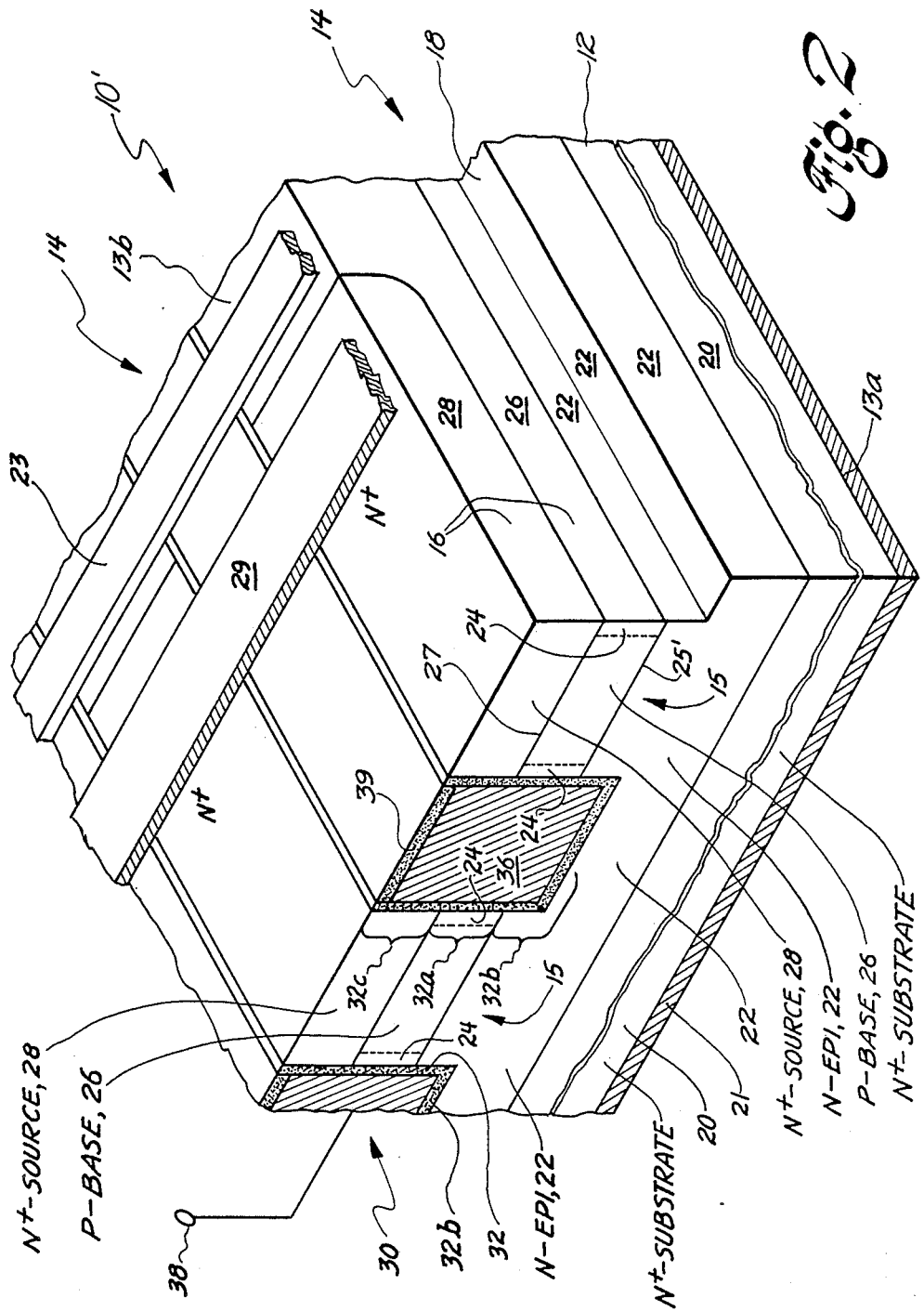
FIG. 2 illustrates a portion of an alternative structure for a device in accordance with the present invention.

An alternative or modified device 10′ is illustrated in FIG. 2. In this modified structure, the substrate or first main region, instead of being a single uniform N+ layer, includes a second, more lightly doped N type layer 22 which spaces the P type base region 26 from the N+ portion of substrate 20. This device structure increases the breakdown voltage of the PN junction between base 26 and layer 22 as compared to the device 10 shown in FIG. 1. In device 10 with region 20 doped with $5 \times 10^{19}$ donor atoms/c$^3$, region 26 doped with $1 \times 10^{17}$ acceptor atoms/c$^3$ and region 28 doped with $5 \times 10^{19}$ donor atoms/c$^3$, the junctions 25 and 27 have breakdown voltages of about 8 volts each. In the device 10′ with the region 20 doped with $5 \times 10^{19}$ donor atoms/c$^3$, region 22 doped with $6 \times 10^{16}$ donor atoms/c$^3$, region 26 doped with $1 \times 10^{17}$ acceptor atoms/c$^3$ and region 28 doped with $5 \times 10^{19}$ donor atoms/c$^3$, the junctions 25′ and 27 have breakdown voltages of about 29 and 8 volts, respectively. This increase in breakdown voltage from about 8 volts for junction 25 in the device 10 of FIG. 1 to about 30 volts for junction 25′ of device 10′ shown in FIG. 2 occurs even with the gate oxide portions 32b and 32c being of the same thickness as gate oxide portion 32a. Layer 22 accomplishes this by reducing the electric field in the vicinity of the bottom of the trenches for a given magnitude and polarity of applied source-to-drain voltage and thereby enables the PN junction 25′ of device 10′ to block a higher voltage than the junction 25 in device 10, for the same source 28, drain 20 and base 26 doping levels and the same gate oxide thicknesses.

If it is desired to increase the breakdown voltage of the upper PN junction 27 in device 10′, there are several alternatives. These include adjusting the relative doping levels of the base 26 and the second main region 28 to change the breakdown voltage of the PN junction 27 therebetween or including a more lightly doped N type buffer layer between the base 26 and the high conductivity portion 28 of the second main region.

This latter buffer layer may be provided by forming the upper N type regions in two stages. The first stage being formed by a N-type diffusion having a low doping level of about $6 \times 10^{16}$ donor atoms/c$^3$ which is partially driven into the P type region 26. The second stage is a heavier N type diffusion through the same mask or openings as the first diffusion. This heavier diffusion preferably has a doping concentration of about $5 \times 10^{19}$ donor atoms/c$^3$. The breakdown voltage of the resulting PN junction between the P type region 26 and the upper N type region then depends on the thickness of the low doping portion of the N type region between the high doping portion of the N-type region and the P type region. If this thickness is great enough, then the breakdown voltage is controlled by the doping level in the low doping level portion of the N type region. These regions may also be formed by ion implantation and annealing, if desired.

In use, either of device 10 and device 10′ is connected in a circuit in the same manner and the devices differ, if at all, primarily in the maximum voltage they can block. The source and drain electrodes are connected in a circuit in the same fashion as prior art field effect transistors. The conductivity of the channel region 24 and thus the conductive state of the device, is determined by the potential of the gate electrode 38 relative to that of the base region 26 as in prior art FETs. However, unlike prior art FETs in which the base is shorted to the source region, this gate potential is not established by applying a voltage between the gate electrode and the source region. Rather, the control voltage must be applied between the gate electrode and the base region electrode. Because the gate-to-base voltage controls the conductivity of the channel region, the gate-to-base potential to be applied to maintain the device in a fully conductive state is essentially independent of the polarity or magnitude of the voltage applied across the source and drain electrodes. Consequently, a single control voltage polarity and magnitude may be applied across the gate and base electrodes in order to render the device conductive without knowledge of, or concern for, whether the source electrode is at a positive or negative voltage relative to the drain electrode. Similarly, a second control voltage polarity and magnitude may be applied across the gate and base electrodes in order to render the device non-conductive without knowledge of, or concern for, whether the source electrode is positive or negative relative to the drain electrode.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A field effect semiconductor device comprising:
   a semiconductor body having first and second, opposed major surfaces including:
      a first main terminal region of one conductivity type extending to said first major surface of said body,
      a second main terminal region of said one conductivity type extending to said second main surface of said body, and
      a base region of an opposite conductivity type disposed between and spacing apart said first and second main terminal regions and having a channel portion extending to said first surface of said semiconductor body;
   an insulated gate electrode disposed on said first surface adjacent to said base region between said first and second main terminal regions for controlling the conductivity of said channel portion between said first and second main terminal regions for carriers of said one conductivity type;
   a first main electrode disposed on said first major surface and ohmically connected to said first main terminal region;
   a second main electrode disposed on said second major surface and ohmically connected to said second main terminal region; and
   a base electrode ohmically connected to said base region; and
   said device being free of first main terminal region-to-base region and second main terminal region-to-base region short circuits whereby said device is bidirectional and the conductivity of said channel region is determined by the potential of said insulated gate electrode relative to said base region.

2. The field effect semiconductor device recited in claim 1 wherein said second main terminal region includes first and second portions having two different one conductivity type doping levels, said first portion being disposed adjacent said second main electrode and having a relatively high doping concentration and being spaced from said base region by said second portion, said second portion having a relatively lower doping concentration than said first portion.

3. The field effect semiconductor device recited in claim 2 wherein said first main terminal region includes first and second portions having two different one conductivity type doping levels, said first portion being disposed adjacent said first main electrode and having a relatively high doping concentration and being spaced from said base region by said second portion, said second portion having a relatively lower doping concentration than said first portion.

4. The field effect semiconductor device recited in claim 1 wherein:
   said semiconductor body includes a trench extending into said body from said second major surface thereof;
   said insulated gate electrode is disposed in said trench; and
   said channel portion of said base region is disposed adjacent to the walls of said trench.

5. The field effect semiconductor device recited in claim 1 wherein:
   said semiconductor body includes a trench extending into said body from said first major surface, said trench extending through said base region to said second main region; and
   said channel region is disposed adjacent the walls of said trench.

6. The field effect semiconductor device recited in claim 5 wherein:
   the insulating layer of said insulated gate electrode is disposed on the surfaces of said trench; and
   said insulating layer is thicker along the portion of said trench adjacent said second main terminal region than it is along the portion of said trench adjacent the base region.

7. A field effect semiconductor device comprising:
   a semiconductor body having first and second opposed major surfaces and including:
      a first main terminal region of one conductivity type extending to said first surface,
      a second main terminal region of said one conductivity type extending to said second surface, and
      a base region of an opposite conductivity type disposed between and spacing apart said first and second main terminal regions, and a trench extending into said body from said first major surface through said first main terminal and base regions to said second main terminal region, said base region having a channel portion extending to the surface of said trench;
   an insulated gate electrode disposed in said trench adjacent said channel portion of said base region for controlling the conductivity of said channel portion between said first and second main terminal regions for carriers of said one conductivity type;
   a first main electrode disposed on said first major surface and ohmically connected to said first main terminal region;
   a second main electrode disposed on said first major surface and ohmically connected to said second main terminal region; and a base electrode separate from said first and second main electrodes and ohmically connected to said base region;

said device being free of first main terminal region to base region and second main terminal region to base region short circuits whereby said device is bidirectional and the conductivity of said channel region is determined by the potential of said insulated gate electrode relative to said base region.

* * * * *